(12) United States Patent
Lee

(10) Patent No.: US 7,391,670 B2
(45) Date of Patent: Jun. 24, 2008

(54) SEMICONDUCTOR MEMORY DEVICE

(75) Inventor: Yin Jae Lee, Icheon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/647,808

(22) Filed: Dec. 28, 2006

(65) Prior Publication Data

US 2008/0002512 A1   Jan. 3, 2008

(30) Foreign Application Priority Data

Jun. 30, 2006   (KR) .................... 10-2006-0061485

(51) Int. Cl.
    *G11C 8/00*  (2006.01)
(52) U.S. Cl. ............................. 365/230.06; 365/230.08; 365/194
(58) Field of Classification Search ............ 365/230.06, 365/230.08, 194
    See application file for complete search history.

(56) References Cited

U.S. PATENT DOCUMENTS 6,272,057 B1   8/2001   Koshikawa
6,333,892 B2 *  12/2001  Hamamoto et al. .... 365/230.08
6,525,989 B2 *  2/2003   Mizugaki et al. ....... 365/230.06
6,545,943 B2 *  4/2003   Mizugaki et al. ....... 365/230.06

FOREIGN PATENT DOCUMENTS

| JP | 10-334699 | 12/1998 |
| KR | 1020000020619 | 4/2000 |
| KR | 1020030089231 | 11/2003 |
| KR | 1020040073789 | 8/2004 |

* cited by examiner

*Primary Examiner*—Huan Hoang
(74) *Attorney, Agent, or Firm*—John P. White; Cooper & Dunham LLP (57) ABSTRACT

A semiconductor memory device is provided. The semiconductor memory device includes an active commander for generating an active command upon receiving a plurality of control signals, a first signal generator configured to receive the active command, and generate a first latch signal for latching information associated with activation of the active command, a second signal generator configured to receive the first latch signal and a chip selection signal, generate a word-line activation signal and activation-information signal when the first latch signal and the chip selection signal are simultaneously enabled, and a reset controller configured to receive a second latch signal, the word-line activation signal, and the activation-information signal, and control the first signal generator to reset the first latch signal using the received signals.

26 Claims, 8 Drawing Sheets

Prior Art

FIG. 1

Prior Art

FIG. 2a

Prior Art

SEMICONDUCTOR MEMORY DEVICE

TECHNICAL FIELD

The present disclosure relates to a semiconductor memory device, and more particularly to a semiconductor memory device capable of preventing a word line from being unnecessarily activated within a specific period prior to the accessing of a next word line after completing a burst operation of the last column of a specific word line during a full-continuous operation of the semiconductor memory device such as a Pseudo SRAM (PSRAM).

DESCRIPTION OF THE RELATED ART

Generally, a Random Access Memory (RAM) which is indicative as a representative example of a semiconductor memory device allows a user to arbitrarily access a memory location, and can record/read desired information, such that it is widely used as a storage unit for computers or peripheral terminals.

A RAM has a variety of advantages, for example, low-cost product, low power-consumption, high-speed call function, non-destructive reading characteristics, etc. However, the RAM has a disadvantage in that all data stored in the RAM is deleted when the RAM is powered off.

There are a variety of RAMs, for example, a dynamic RAM (DRAM), and a static RAM (SRAM), etc. The DRAM requires a refresh operation at intervals of a predetermined time on the condition that the DRAM remains powered on, such that data of the DRAM is not deleted by the refresh operation. The SRAM does not delete its data on the condition that the SRAM remains powered on.

As described above, if data is deleted from a memory when the memory is powered off in the same manner as in the DRAM, such a memory is called a volatile memory. If data is not deleted from a memory if the memory is powered off in the same manner as in the SRAM, this memory is called a nonvolatile memory.

The SRAM has an advantage in that it can easily access other integrated circuits (ICs). However, if a user desires to provide the SRAM with the same storage capacity as that of the DRAM, the SRAM requires three or four times more elements than those of the DRAM. As a result, the SRAM is more complex than the DRAM, and is more expensive than the DRAM.

In order to solve the above-mentioned problems of the above-mentioned RAMs, many developers have recently conducted intensive research into a pseudo SRAM (PSRAM) capable of implementing the same functions as those of the SRAM using the DRAM cells. The pseudo SRAM (PSRAM) has a chip size smaller than that of the conventional SRAM, and can also implement high integration superior to that of the conventional SRAM.

However, cells of the pseudo SRAM (PSRAM) have the same configuration as that of a DRAM cell, such that the pseudo SRAM (PSRAM) requires an internal refresh operation.

The conventional semiconductor memory device such as the pseudo SRAM (PSRAM) mentioned above has a disadvantage in that it unnecessarily activates word lines within a specific period prior to the accessing of a next word line after completing a burst operation of the last column of a specific word line during a full-continuous operation, resulting in increase of current consumption and reduction of data bandwidth.

The above-mentioned problems of the conventional semiconductor memory device will hereinafter be described with reference to FIGS. 1, 2A, 2B, and 9.

Figure 1:
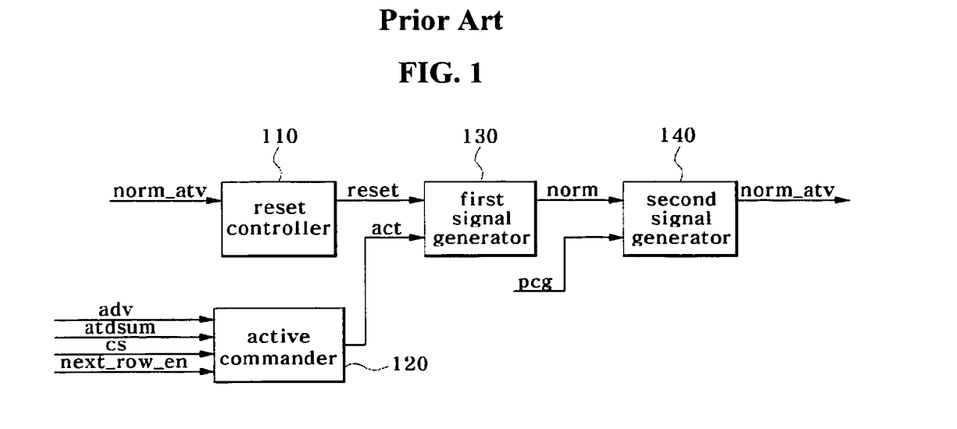
FIG. 1 is a circuit diagram illustrating a conventional semiconductor memory device.

FIG. 1 is a block diagram illustrating a conventional semiconductor memory device.

Referring to FIG. 1, if an active commander 120 receives a plurality of control signals (adv, atdsum, CS, and next_row_en), and generates an active command (act), a first signal generator 130 receives the active command (act), and generates a latch signal (norm) for latching information associated with the activation of the active command (act) if the active command (act) is activated.

In this case, the above-mentioned signal (adv) is indicative of a specific signal enabled from a low level to a high level upon receipt of an external address.

The above-mentioned signal (CS) indicates a chip selection signal (i.e., a signal capable of selecting or deselecting a chip). The signal (/CS) is an inverting signal of the CS signal. The above-mentioned signal (next_row_en) is enabled when a user desires to enable the next word line of a current word line.

If any one of the above-mentioned control signals (adv, atdsum, CS, and next_row_en) is enabled, the active commander 120 enables the active command (act) in response to the enabled control signal, and outputs the enabled active command (act).

If the active command (act) is enabled or activated, the above-mentioned latch signal (norm) latches the enabled or activated active command (act). The first signal generator 130 generates the latch signal (norm) in response to the enabled active command (act). Thereafter, the reset signal (reset) is enabled after the lapse of a predetermined time, and the first signal generator 130 resets the latch signal (norm).

The second signal generator 140 receives the latch signal (norm) and the precharge signal (pcg). If the precharge signal (pcg) is enabled, the second signal generator 140 replies to the enabled latch signal (norm), and generates a word-line activation signal (norm_atv) for activating the word line.

The reset controller 110 receives the word-line activation signal (norm_atv), and generates a reset signal (reset) for resetting the latch signal (norm) in response to the enabled word-line activation signal (norm_atv). A detailed description of the reset controller 110 will hereinafter be described with reference to FIGS. 2A~2B.

Figure 2A:
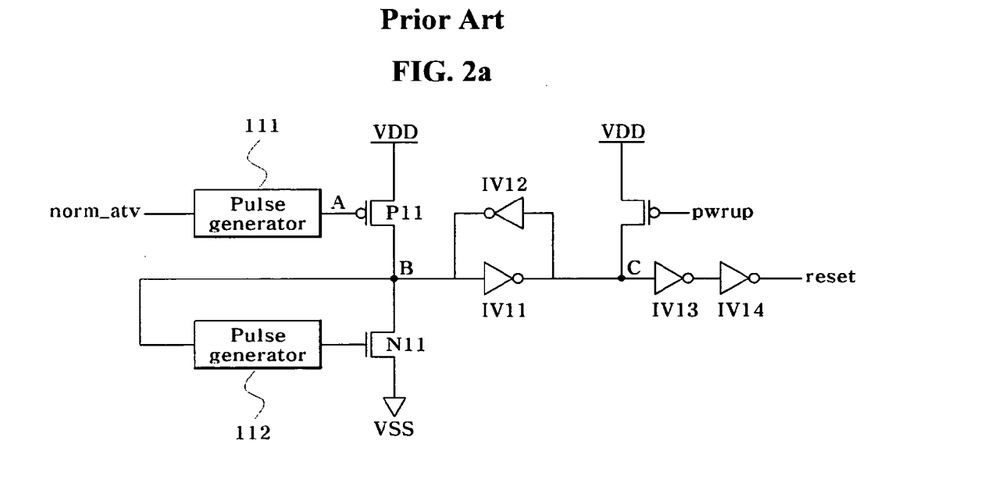
FIG. 2A is a circuit diagram illustrating a reset controller for use in the conventional semiconductor memory device.
Figure 2B:
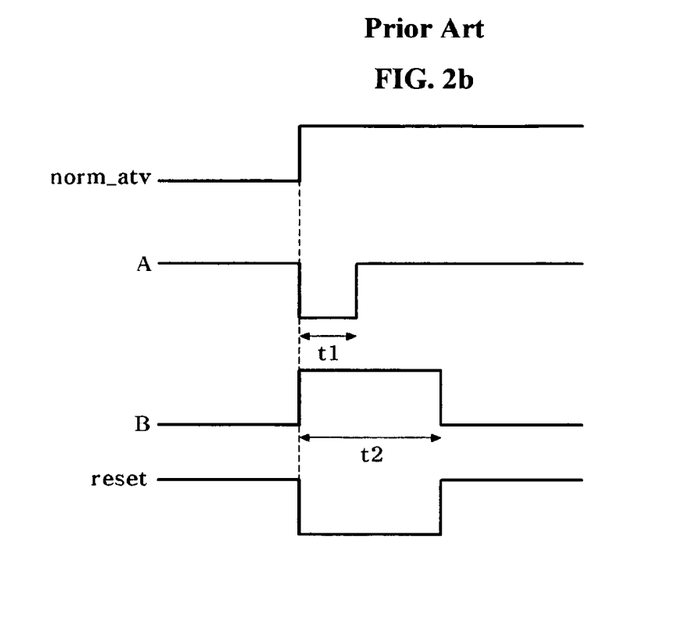
FIG. 2B is a timing diagram illustrating individual signals for use in the reset controller of the conventional semiconductor memory device.

FIG. 2A is a circuit diagram illustrating the reset controller for use in the conventional semiconductor memory device. FIG. 2B is a timing diagram illustrating individual signals of the reset controller of the conventional semiconductor memory device.

Referring to FIGS. 2A~2B, if an input signal is enabled to a high level, a first pulse generator 111 generates a pulse signal transitioned to a low level during a first period (t1), and a second pulse generator 112 generates another pulse signal transitioned to the low level during a second period (t2) (where t1<t2).

As can be seen from FIG. 2B, an output signal (A) of the first pulse generator 111 maintains a high level within a specific period in which the word-line activation signal (norm_atv) enters a low level, such that the PMOS (P11) is switched off.

The second pulse generator 112 receives a low-level signal (B), and outputs a high-level signal, such that the NMOS (N11) is switched on. Therefore, the reset signal (reset) maintains the high level within a specific period in which the word-line activation signal (norm_atv) enters the low level, as depicted in FIG. 2B.

Subsequently, if the word-line activation signal (norm_atv) is enabled from the low level to the high level, the output signal (A) of the first pulse generator 111 is transitioned from the high level to the low level during the first period (t1), such that the PMOS (P11) is switched on and the signal (B) enters the high level. The second pulse generator 112 receives the high-level signal (B), and outputs the low-level signal during the second period (t2), such that the NMOS (N11) is switched off. Therefore, the reset signal (reset) is transitioned from the high level to the low level, as depicted in FIG. 2B.

If the word-line activation signal (norm_atv) is activated, the result controller 110 enables the reset signal (reset) to have a low level, outputs the low-level enabled reset signal (reset), and the first signal generator 130 disables the latch signal (norm) in response to the reset signal (reset).

However, the conventional semiconductor memory device has a disadvantage in that it unnecessarily activates word lines within a specific period prior to the accessing of a next word line after completing a burst operation of the last column of a specific word line during a full-continuous operation.

In this case, the full-continuous operation automatically accesses the next word line after completing the burst operation of the last column of a specific word line, instead of accessing only a single word line by a single command, such that the user can access all the memories of the semiconductor memory device using only one command.

Figure 9:
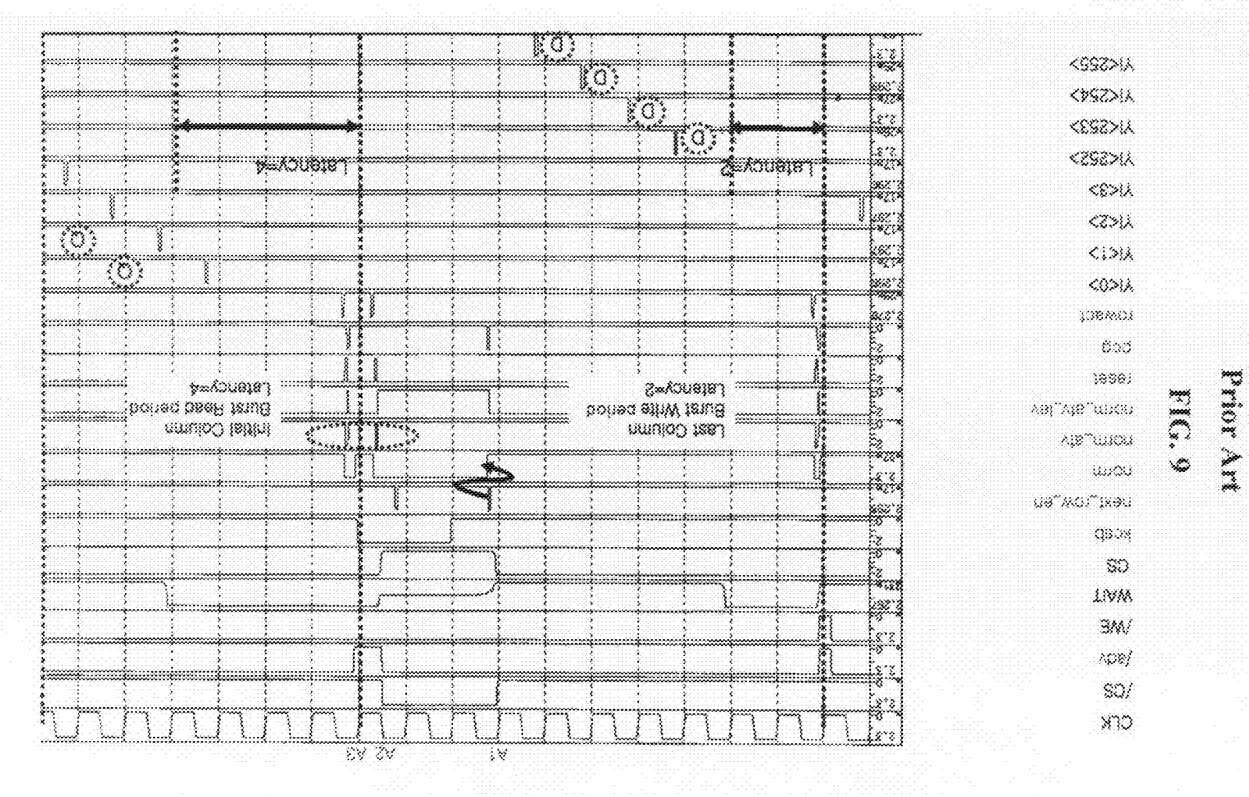
FIG. 9 is a timing diagram illustrating operations of a conventional semiconductor memory device.

FIG. 9 is a timing diagram illustrating operations of a conventional semiconductor memory device.

Referring to FIG. 9, if the burst operation of the last column of a specific word line is completed, the chip selection signal (/CS) is disabled from the low level to the high level in the vicinity of the point (A1). If the signal (next_row_en) is enabled to a high level so as to enable the next word line, the latch signal (norm) is transitioned to the high level in response to the enabled signal (next_row_en).

However, if the chip selection signal (/CS) is disabled to the high level so as to implement the chip de-selection state, the conventional semiconductor memory device does not generate the word-line activation signal (norm_atv), and the reset signal (reset) is not enabled to the low level, the latch signal (norm) continuously maintains the high level as depicted in FIG. 9.

In order to prepare the burst operation of the first column of the next word line, the chip selection signal (/CS) is enabled to the low level at the point (A2). In this case, the latch signal (norm) enters the high-level state, the word-line activation signal (norm_atv) is enabled in response to the high-level latch signal (norm), and the row-active signal (rowact) is also enabled, such that the word line is activated.

However, the normal word-line activation operation of the next word line is designed to be executed after the lapse of the point (A3). Therefore, the word-line activation operation in the vicinity of the point (A2) is needless. By the above-mentioned unnecessary word-line activation operation, the conventional semiconductor memory device results in increase of current consumption and reduction of a data bandwidth corresponding to an amount of data capable of being processed for each unit-time.

Typically, a semiconductor memory device is designed to output data after the lapse of a predetermined latency after the burst operation begins, and an external testing device is designed to fix its latency to be suitable for the predetermined latency. Therefore, if the above-mentioned unnecessary word-line activation operations occur as described above, the external testing device cannot be synchronized with an output point of real data contained in the semiconductor memory device, resulting in deterioration of testability.

There is a need for a semiconductor memory device which prevents a word line from being unnecessarily activated within a specific period prior to the accessing of a next word line after completing a burst operation of the last column of a specific word line during a full-continuous operation of the semiconductor memory device such as a Pseudo SRAM (PSRAM), such that it reduces an amount of current consumption, prevents a data bandwidth from being reduced, and increases testability.

SUMMARY

In accordance with a preferred embodiment of the present disclosure, a semiconductor memory device is provided which includes an active commander for generating an active command upon receiving a plurality of control signals, a first signal generator configured to receive the active command, and generate a first latch signal for latching information associated with activation of the active command, a second signal generator configured to receive the first latch signal and a chip selection signal, and generate a word-line activation signal and activation-information signal when the first latch signal and the chip selection signal are simultaneously enabled, and a reset controller configured to receive a second latch signal, the word-line activation signal, and the activation-information signal, and control the first signal generator to reset the first latch signal using the received signals.

Preferably, if the activation-information signal is disabled, the reset controller resets the first latch signal in response to a disabling state of the second latch signal.

Preferably, the reset controller includes a first logic unit for performing a first logic operation between a buffering signal of the second latch signal and the activation-information signal, a first pulse generator for generating a first pulse signal having a predetermined enable period in response to an output signal of the first logic unit, a second logic unit for performing a second logic operation between an output signal of the first pulse generator and the word-line activation signal, and a pulse generator for generating a second pulse signal having a predetermined enable period as a reset signal in response to an output signal of the second logic unit.

Preferably, the reset controller further includes a buffer which is located between the first pulse generator and the second logic unit, buffers the first pulse signal, and transmits the buffered first pulse signal to the second logic unit.

Preferably, the first logic unit performs a NOR operation, and the second logic unit performs an OR operation.

Preferably, the first pulse signal generated from the first pulse generator and the second pulse signal generated from the second pulse generator have respective low-level enable periods.

Preferably, the first pulse generator includes a delay for delaying the output signal of the first logic unit by a predetermined time, and outputting the delayed signal, a buffer for buffering an output signal of the delay, and a third logic unit for performing a logic operation between an output signal of the buffer and the output signal of the first logic unit, and generating the first pulse signal.

Preferably, the buffer includes an inverter, and the third logic unit performs a NAND operation.

Preferably, the second pulse generator includes a delay for delaying the output signal of the second logic unit by a predetermined time, and outputting the delayed signal, a buffer for buffering an output signal of the delay, and a third logic unit for performing a logic operation between an output signal of the buffer and the output signal of the second logic unit, and generating the second pulse signal.

Preferably, the buffer includes an inverter, and the third logic unit performs a NAND operation.

Preferably, the first signal generator includes a first pull-up element for pull-up-driving a specific node in response to a reset signal generated from the reset controller, a first pull-down element for pull-down-driving the specific node in response to the reset signal, a second pull-down element which is located between the first pull-down element and a ground terminal, and is operated by the active command, and a latch unit for latching a signal of the specific node, at the same time inversely buffering the signal of the specific node, and generating the inversely-buffered signal.

Preferably, the first signal generator further includes a second pull-up element for pull-up-driving the specific node in response to a power-up or initialization signal.

Preferably, the second signal generator includes a first pull-up element for pull-up-driving a first node in response to a precharge signal, a first pull-down element for pull-down-driving the first node in response to a specific control signal, a first logic unit for performing a logic operation between a signal of the first node and the first latch signal, a first latch unit for latching an output signal of the first logic unit, a buffer for inversely buffering the output signal of the first latch unit, and generating the word-line activation signal, and a signal processor for receiving the word-line activation signal, and generating the activation-information signal.

Preferably, the second signal generator further includes a delay for delaying the word-line activation signal by a predetermined period, and provides the delayed word-line activation signal as the control signal.

Preferably, the second signal generator further includes a second latch unit which is located between the first pull-down element and the first logic init, latches the signal of the first node, at the same time buffers the latched signal, and transmits the buffered signal to the first logic unit.

Preferably, the first latch unit includes a first logic unit configured to receive the output signal of the first logic unit at its input terminal, and a second logic unit configured to receive the chip selection signal at its input terminal, wherein the first logic unit and the second logic unit are cross-coupled to each other.

Preferably, the first logic unit and the second logic unit are respective NAND gates.

Preferably, the first logic unit performs an AND operation.

Preferably, the signal processor disables the activation-information signal by referring to an enabling state of the precharge signal.

Preferably, the signal processor includes a second pull-up element for pull-up-driving a second node in response to the word-line activation signal, a second pull-down element for pull-down-driving the second node in response to the word-line activation signal, a third pull-up element which is located between the second pull-up element and an external-voltage terminal, and is operated by the precharge signal, and a second latch unit for latching the signal of the first node, buffering the first-node signal, and generating the activation-information signal.

Preferably, the signal processor further includes a fourth pull-up element for pull-up-driving the second node in response to a power-up or initialization signal.

Preferably, the second signal generator further includes a second pull-up element for pull-up-driving the first node in response to a power-up or initialization signal.

BRIEF DESCRIPTION OF THE DRAWINGS

The above-mentioned and other features and advantages of the subject matter of the present disclosure will be more clearly understood from the following detailed description taken in conjunction with the accompanying drawings, in which.

DESCRIPTION OF THE PREFERRED EMBODIMENTS

Now, preferred embodiments of the present disclosure will be described in detail with reference to the annexed drawings. In the drawings, the same or similar elements are denoted by the same reference numerals even though they are depicted in different drawings. In the following description, a detailed description of known functions and configurations incorporated herein will be omitted when it may make the subject matter of the present disclosure rather unclear.

A semiconductor memory device according to a preferred embodiment of the present disclosure will hereinafter be described with reference to FIGS. 3-8 and 10.

Figure 3:
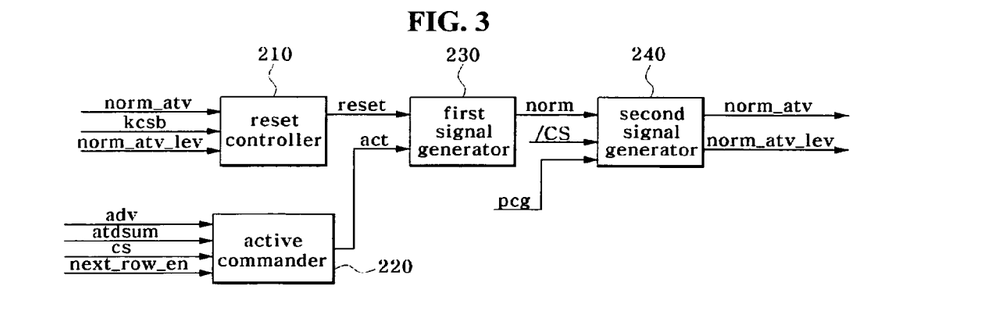
FIG. 3 is a circuit diagram illustrating a semiconductor memory device according to an exemplary embodiment of the present disclosure.

Referring to FIG. 3, the semiconductor memory device according to the preferred embodiment of the present disclosure includes an active commander 220, a first signal generator 230, a second signal generator 240, and a reset controller 210.

The active commander 220 generates an active command (act) upon receiving a plurality of control signals (adv, atdsum, CS, and next_row_en).

The first signal generator 230 receives the active command (act), and generates the latch signal (norm) for latching information associated with activation of the active command (act).

The second signal generator 240 receives the latch signal (norm) and the chip selection signal (/CS), generates a word-line activation signal (norm_atv) for activating a word line when the latch signal (norm) and the chip selection signal (/CS) are simultaneously enabled, and at the same time generates an activation information signal (norm_atv_lev) for maintaining activation information of the word-line activation signal (norm_atv) during a predetermined period.

The reset controller 210 receives a latch signal (kcsb) generated by synchronizing the chip selection signal (/CS) with a clock signal, the word-line activation signal (norm_atv), and the activation-information signal (norm_atv_lev), and in response to the disabling of the latch signal (kcsb) or the enabling of the word-line activation signal (norm_atv), controls the first signal generator 230 to reset the latch signal (norm).

Figure 4:
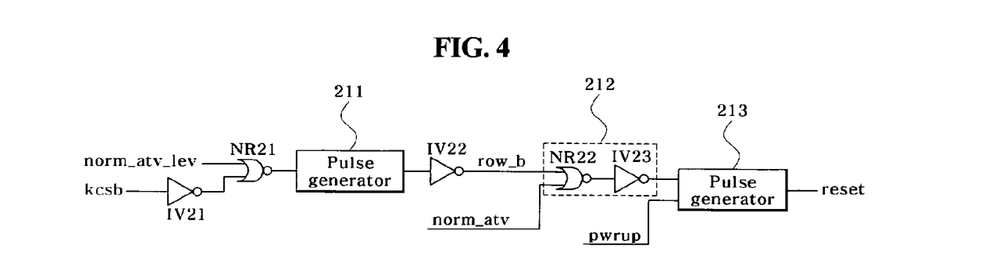
FIG. 4 is a circuit diagram illustrating a reset controller which can be used in the semiconductor memory device of FIG. 3.

Referring to FIG. 4, the reset controller 210 includes a NOR gate (NR21), a pulse generator 211, a logic unit 212, and a pulse generator 213.

The NOR gate (NR21) performs a NOR operation between a buffering signal of the latch signal (kcsb) and the activation-information signal (norm_atv_lev).

The pulse generator 211 generates a first pulse signal having a predetermined enable period in response to an output signal of the NOR gate (NR21).

The logic unit 212 performs an OR operation between an output signal of the pulse generator 211 and the word-line activation signal (norm_atv).

The pulse generator 213 generates a second pulse signal having a predetermined enable period as a reset signal (reset) in response to an output signal of the logic unit 212.

Figure 6:
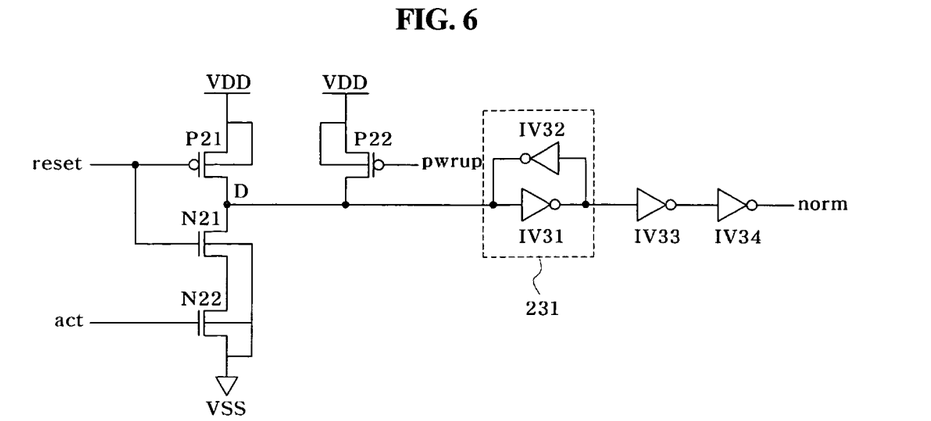
FIG. 6 is a circuit diagram illustrating a first signal generator which can be used in the semiconductor memory device of FIG. 3.

Referring to FIG. 6, the first signal generator 230 includes a PMOS (P21), an NMOS (N21), an NMOS (N22), and a latch unit 231.

The PMOS (P21) pull-up-drives a node (D) in response to the reset signal (reset) generated from the reset controller 210. The NMOS (N21) pull-down-drives the node (D) in response to the reset signal (reset). The NMOS (N22) is located between the NMOS (N21) and a ground terminal (VSS), and is operated by the active command (act). The latch unit 231 latches a signal of the node (D), and at the same time inversely buffers the latched node-D signal.

Figure 7:
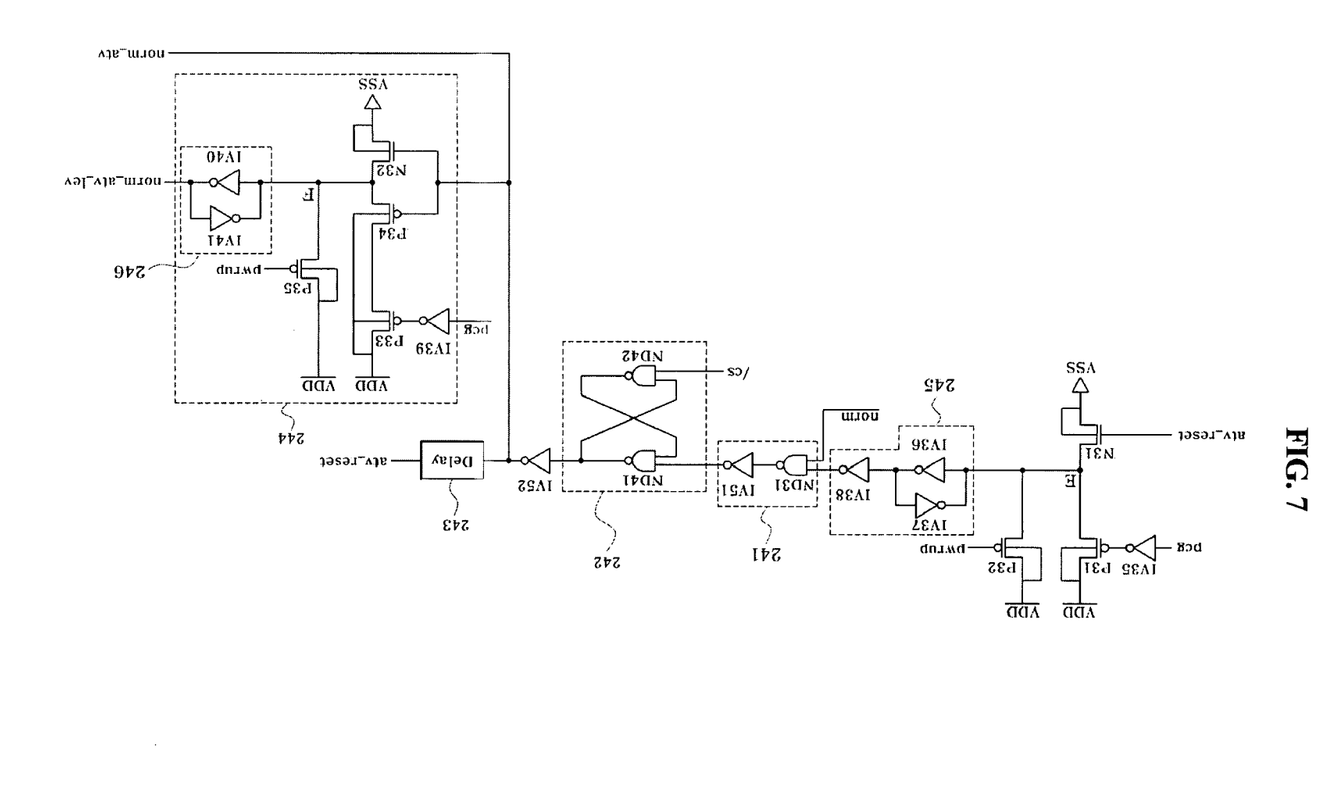
FIG. 7 is a circuit diagram illustrating a second signal generator which can be used in the semiconductor memory device of FIG. 3.

Referring to FIG. 7, the second signal generator 240 includes a PMOS (P31), an NMOS (N31), a logic unit 241, a latch unit 242, an inverter (IV52), a signal processor 244, and a delay 243.

The PMOS (P31) pull-up-drives a node (E) in response to a precharge signal (pcg). The NMOS (N31) pull-down-drives the node (E) in response to a control signal (atv_reset). The logic unit 241 performs an AND operation between a signal of the node (E) and the latch signal (norm). The latch unit 242 latches an output signal of the logic unit 241. The inverter (IV52) inversely buffers the output signal of the latch unit 242, and generates the word-line activation signal (norm_atv). The signal processor 244 receives the word-line activation signal (norm_atv), and generates the activation-information signal (norm_atv_lev). The delay 243 delays the word-line activation signal (norm_atv) by a predetermined period, and provides the delayed word-line activation signal (norm_atv) as the control signal (atv_reset).

Operations of the above-mentioned semiconductor memory device according to a preferred embodiment of the present disclosure will hereinafter be described with reference to FIGS. 3-8 and 10.

If the active commander 220 of FIG. 3 generates a plurality of control signals (adv, atdsum, CS, and next_row_en), and generates the active command (act), the first signal generator 230 receives the active command (act), and generates the latch signal (norm) for latching information associated with activation of the active command (act). In this case, it should be noted that the control signals (adv, atdsum, CS, and next_row_en) are the same as those of the conventional art.

Operations of the active commander 220 will hereinafter be described with reference to FIG. 5.

Figure 5:
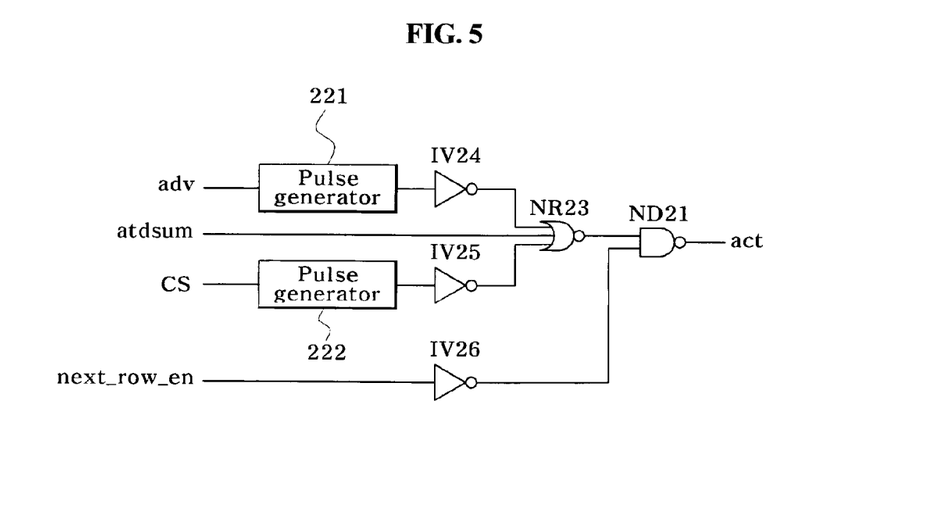
FIG. 5 is a circuit diagram illustrating an active commander which can be used in the semiconductor memory device of FIG. 3.
Figure 8:
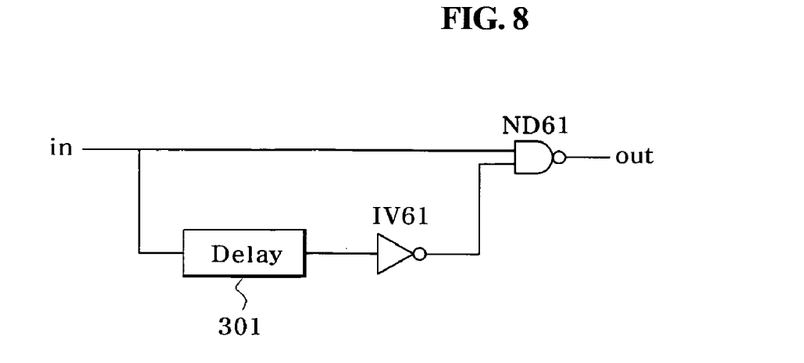
FIG. 8 is a circuit diagram illustrating a pulse generator according to an exemplary embodiment of the present disclosure.

Referring to FIG. 5, the signal (adv) is received in the pulse generator 221. The pulse generator 221 of FIG. 5 is the same as that of FIG. 8. FIG. 8 is a circuit diagram illustrating a pulse generator according to an exemplary embodiment of the present disclosure.

If the input signal (in) enters a low level, the output signal (out) enters a high-level state. In this case, the output signal of the inverter (IV61) enters the high-level state. Thereafter, if the input signal (in) is transitioned to the high level, a NAND gate (ND61) receives two high-level signals, and outputs the low-level signal.

Subsequently, if a predetermined delay time elapses by the delay 301, the output signal of the inverter (IV61) is transitioned to the low level, such that the output signal of the NAND gate (ND61) is re-transitioned to the high level. Therefore, if the output signal (adv) of the pulse generator 221 is enabled to the high level, it is transitioned to the low level during a predetermined period.

As a result, if the signal (adv) is enabled to the high level, the output signal of the pulse generator 221 acts as a pulse signal transitioned to the low level during a predetermined period, and the output signal of the inverter (IV24) acts as a pulse signal transitioned to the high level during a predetermined period.

In this way, the pulse generator 222 is equal to the pulse generator. Therefore, if the chip selection signal (CS) of the pulse generator 222 is enabled to the high level, the output signal of the inverter (IV25) is transitioned to the high level during a predetermined period.

In the meantime, the NOR gate (NR23) and the NAND gate (ND21) of FIG. 5 perform the OR operation. Therefore, the active command (act) generated from the active commander 220 is activated to have the high level if any one of the control signals (adv, atdsum, CS, and next_rowen) is enabled.

IF the active command (act) is enabled (or activated), the latch signal (norm) maintains (or latches) information associated with the activation of the active command (act).

The first signal generator 230 generates the latch signal (norm) in response to the enabled active command (act). However, if the reset signal (reset) is then enabled, the first signal generator 230 resets the latch signal (norm). A detailed description of the first signal generator 230 will hereinafter be described with reference to FIG. 6.

Referring to FIG. 6, the PMOS (P22) initializes the node (D) in response to a power-up (or initialization) signal (pwrup). If the active command (act) is enabled to the high level on the condition that the reset signal (reset) enters the high level, the node (D) is transitioned to the low level, and the latch signal (norm) is transitioned from the low level to the high level.

Thereafter, the latch signal (norm) maintains the high level by the latch unit 231 before the reset signal (reset) is enabled to the low level. If the reset signal (reset) is enabled to the low level, the PMOS (P21) is switched on, the node (D) is transitioned to the high level, and the latch signal (norm) is transitioned from the high level to the low level, such that the latch signal (norm) is reset at the low level.

In conclusion, the latch signal (norm) is enabled to the high level by the active command (act), in response to the enabling of the reset signal (reset), such that it is reset to the low level.

The second signal generator 240 of FIG. 3 receives the latch signal (norm), the chip selection signal (/CS), and the precharge signal (pcg). If the latch signal (norm) and the chip selection signal (/CS) are simultaneously enabled, the second signal generator 240 generates the word-line activation signal (norm_atv) for activating the word line, and at the same time generates the activation-information signal (norm_atv_lev) capable of maintaining activation information of the word-line activation signal (norm_atv) during a predetermined period. A detailed description of the second signal generator 240 will hereinafter be described with reference to FIG. 7.

If the burst operation of the last column of a specific word line is completed, the precharge signal (pcg) for a precharge operation is enabled to the high level. Therefore, the PMOS (P31) is switched on, the node (E) is transitioned to the high level, and the output signal of the inverter (IV38) enters the high level. Thereafter, if the latch signal (norm) is transitioned to the high level, the output signal of the logic unit 241 is transitioned from the low level to the high level.

In this case, if the chip selection signal (/CS) indicating the chip selection state enters the low level, the output signal of the NAND gate (ND24) enters the high level, such that the output signal of the NAND gate (ND41) enters the low level, and the word-line activation signal (norm_atv) enters the high level.

If the delay period for the delay 243 elapses, the control signal (atv_reset) is transitioned to the high level, the NMOS (N31) is switched on, the node (E) is transitioned to the low level, and the output signal of the inverter (IV38) enters the low level. Therefore, the output signal of the logic unit 241 enters the low level irrespective of the state of the latch signal (norm), and the latch unit 242 outputs the high-level signal, such that the word-line activation signal (norm_atv) is re-transitioned to the low level. In conclusion, the word-line activation signal (norm_atv) is enabled to the high level during a predetermined period if the latch signal (norm) is transitioned from the chip selection state to the high level, and is then re-transitioned to the low level.

The signal processor 244 of FIG. 7 receives the word-line activation signal (norm_atv), and generates the activation-information signal (norm_atv_lev). In more detail, as previously stated above, if the word-line activation signal (norm_atv) is enabled to the high level, the NMOS (N32) is switched on, the node (F) is transitioned to the low level, and the activation-information signal (norm_atv_lev) is enabled to the high level, such that the activation-information signal (norm_atv_lev) maintains the high level during a predetermined period by the latch unit 246.

Thereafter, if the precharge signal (pcg) is enabled to the high level to perform the precharge operation, the PMOS (P33) and the PMOS (P34) are switched on, the node (F) is transitioned to the high level, and the activation-information signal (norm_atv_lev) is disabled to the low level. In conclusion, if the word-line activation signal (norm_atv) enters the high level, the activation-information signal (norm_atv_lev) latches information indicating the high-level word-line activation signal (norm_atv), such that the high-level word-line activation signal (norm_atv) is maintained until the precharge signal (pcg) is enabled.

The reset controller 210 of FIG. 3 controls the first signal generator 230 to receive the latch signal (kcsb), the word-line activation signal (norm_atv), and the activation-information signal (norm_atv_lev), such that the first signal generator 230 resets the latch signal (norm) in response to the disabling of the latch signal (kcsb) or the enabling of the word-line activation signal (norm_atv). A detailed description thereof is provided below. For reference, the above-mentioned latch signal (kcsb) is generated when the chip selection signal (/CS) is latched in synchronization with the clock signal (CLK). As can be seen from FIG. 10, the latch signal (kcsb) is generated when the chip selection signal (/CS) is latched in synchronization with the rising edge of the clock signal (CLK).

As shown in FIG. 4, if the word-line activation signal (norm_atv) is enabled to the high level, the logic unit 212 for the OR operation outputs the high-level signal, such that the reset signal (reset) acting as the output signal of the pulse generator 213 acts as a pulse signal enabled to the low level during a predetermined period. In this case, basic configuration of the pulse generator 213 is equal to that of the pulse generator 221 of FIG. 8. However, it should be noted that the pulse generator 213 is initialized by the power-up (or initialization) signal (pwrup) differently from the pulse generator 221 of FIG. 8.

In the meantime, if the latch signal (kcsb) is transitioned to the high level on the condition that the activation-information signal (norm_atv_lev) enters the low level, the output signal of the NOR gate (NR21) is transitioned to the high level, such that the output signal of the pulse generator 211 acts as a pulse signal transitioned to the low level during a predetermined period, and the output signal of the inverter IV22 acts as a pulse signal transitioned to the high level during a predetermined period. Therefore, the logic unit 212 for the OR operation outputs the high-level signal, such that the reset signal (reset) indicating the output signal of the pulse generator 213 acts as a pulse signal enabled to the low level during a predetermined period.

The enabled reset signal (reset) is applied to the first signal generator 230, such that the first signal generator 230 resets the latch signal (norm) from the high level to the low level.

In this way, the reset controller 210, in response to the disabling of the latch signal (kcsb) or the enabling of the activation-information signal (norm_atv_lev), generates the reset signal for resetting the latch signal (norm), such that it can control the first signal generator 230 using the generated reset signal.

Compared with the conventional semiconductor memory device, the semiconductor memory device according to the present disclosure prevents a word line from being unnecessarily activated within a specific period prior to the accessing of a next word line after completing a burst operation of the last column of a specific word line during a full-continuous operation. A detailed description of the semiconductor memory device according to a preferred embodiment of the present disclosure will hereinafter be described with reference to FIG. 10.

Figure 10:
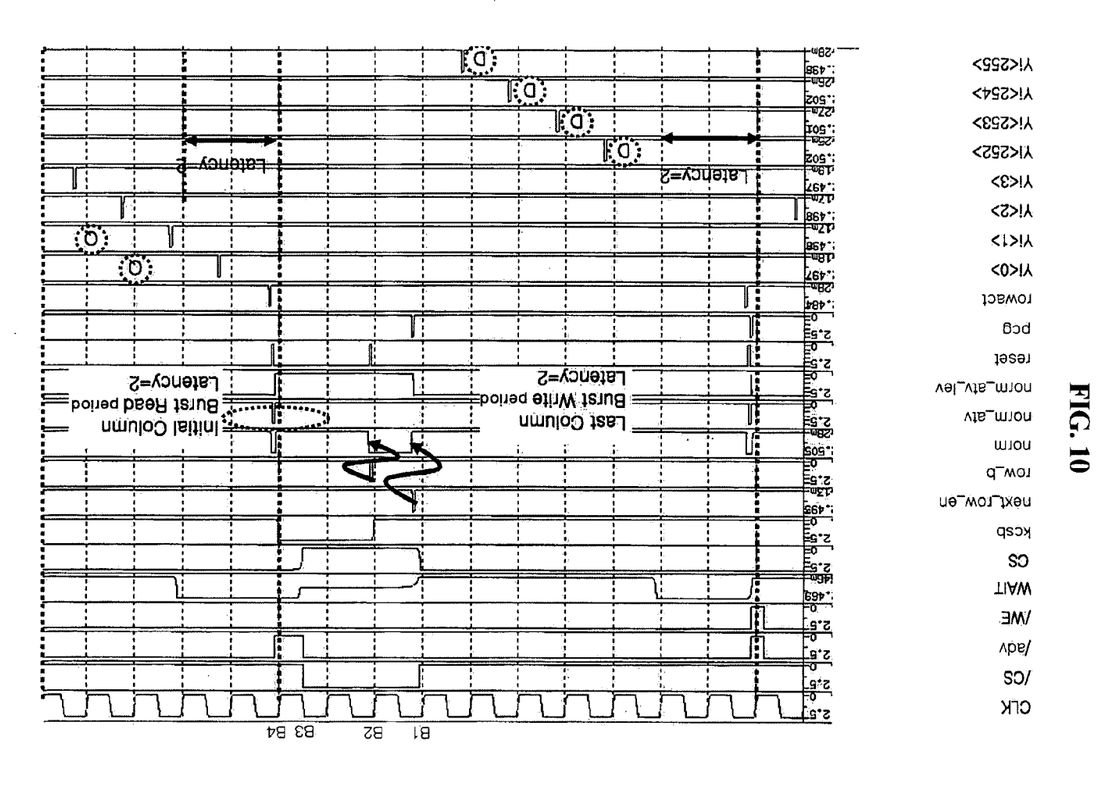
FIG. 10 is a timing diagram illustrating operations of the semiconductor memory device of FIG. 3.

Referring to FIG. 10, if the burst operation of the last column of a specific word line is completed, the chip selection signal (/CS) is disabled from the low level to the high level in the vicinity of the point (B1), and the precharge signal (pcg) is enabled from the low level to the high level to perform the precharge operation. If the signal (next_row_en) is enabled to the high level to enable the next word line, the active command (act) is enabled to the high level by the active commander 220 of FIG. 5, and the latch signal (norm) acting as the output signal of the first signal generator 230 of FIG. 6 is also transitioned to the high level. For reference, if the precharge signal is enabled to the high level, the activation-information signal (norm_atv_lev) generated from the second signal generator 240 of FIG. 3 is transitioned to the low level.

Thereafter, if the latch signal (kcsb) is transitioned to the high level in synchronization with the rising edge of the clock signal (CLK) at the point (P2) of FIG. 10, the reset signal (reset) indicating the output signal of the reset controller 210 is enabled to the low level, such that the latch signal (norm)

indicating the output signal of the first signal generator 230 is transitioned from the high level to the low level.

Subsequently, if a current time reaches the point (B3) of FIG. 10, the chip selection signal (/CS) is enabled to the low level so as to prepare the operations of the next word line. In this case, the latch signal (norm) enters the low level. As a result, although the chip selection signal (/CS) of the second signal generator 240 is enabled to the low level, the latch unit 242 continuously outputs the high-level signal in response to the low-level signal generated from the logic unit 241, such that the word-line activation signal (norm_atv) continuously maintains a previous state (i.e., the low-level state).

Thereafter, if a current time reaches the point (B4), the word-line activation operation of the next word line begins, such that the word-line activation signal (norm_atv) is activated.

In conclusion, the semiconductor memory device according to the present disclosure prevents a word line from being unnecessarily activated within a specific period prior to the accessing of a next word line after completing a burst operation of the last column of a specific word line during a full-continuous operation. In other words, although the chip selection signal (/CS) is disabled to the high level and is then enabled at the point (B3), the latch signal (norm) has been already reset at the low level, such that the second signal generator 240 does not generate the word-line activation signal (norm_atv), and the word line is not activated within the above-mentioned period.

Therefore, the semiconductor memory device according to the present disclosure does not generate unnecessary activation operations of the word line, and prevents the occurrence of unnecessary current consumption, resulting in the reduction of current consumption. Also, the semiconductor memory device according to the present disclosure can prevent the reduction of the data bandwidth indicating an amount of data processed for each unit-time.

In addition, the semiconductor memory device, which is designed to generate data after the lapse of a predetermined latency after the burst operation begins, does not generate unnecessary word-line activation operations, such that the external testing device can be properly synchronized at a real-data output point of the semiconductor memory device, resulting in the increase of testability.

As apparent from the above description, the semiconductor memory device according to the present disclosure prevents a word line from being unnecessarily activated within a specific period prior to the accessing of a next word line after completing a burst operation of the last column of a specific word line during a full-continuous operation, such that it reduces an amount of current consumption, prevents a data bandwidth from being reduced, and increases testability.

Although preferred embodiments of the present disclosure have been disclosed for illustrative purposes, those skilled in the art will appreciate that various modifications, additions and substitutions are possible, without departing from the scope and spirit of the disclosure and the accompanying claims.

This patent specification is based on and claims the priority of Korean patent application no. 2006-61485, filed Jun. 30, 2006, the entire contents of which are incorporated by reference herein.

What is claimed is:

1. A semiconductor memory device comprising:
   an active commander configured to generate an active command upon receiving a plurality of control signals;
   a first signal generator configured to receive the active command, and generate a first latch signal for latching information associated with activation of the active command;
   a second signal generator configured to receive the first latch signal and a chip selection signal, and generate a word-line activation signal and an activation-information signal when the first latch signal and the chip selection signal are simultaneously enabled; and
   a reset controller configured to receive a second latch signal, the word-line activation signal, and the activation-information signal, and control the first signal generator to reset the first latch signal using the received signals.

2. The semiconductor memory device according to claim 1, wherein the reset controller, if the activation-information signal is disabled, resets the first latch signal in response to a disabling state of the second latch signal.

3. The semiconductor memory device according to claim 2, wherein the reset controller includes:
   a first logic unit configured to perform a first logic operation between a buffering signal of the second latch signal and the activation-information signal;
   a first pulse generator configured to generate a first pulse signal having a predetermined enable period in response to an output signal of the first logic unit;
   a second logic unit configured to perform a second logic operation between an output signal of the first pulse generator and the word-line activation signal; and
   a pulse generator configured to generate a second pulse signal having a predetermined enable period as a reset signal in response to an output signal of the second logic unit.

4. The semiconductor memory device according to claim 3, wherein the reset controller further includes:
   a buffer located between the first pulse generator and the second logic unit, wherein said buffer buffers the first pulse signal, and transmits the buffered first pulse signal to the second logic unit.

5. The semiconductor memory device according to claim 3, wherein the first logic unit performs a NOR operation, and the second logic unit performs an OR operation.

6. The semiconductor memory device according to claim 3, wherein the first pulse signal generated from the first pulse generator and the second pulse signal generated from the second pulse generator have respective low-level enable periods.

7. The semiconductor memory device according to claim 6, wherein the first pulse generator includes:
   a delay configured to delay the output signal of the first logic unit by a predetermined time, and output the delayed signal;
   a buffer configured to buffer an output signal of the delay; and
   a third logic unit configured to perform a logic operation between an output signal of the buffer and the output signal of the first logic unit, and generate the first pulse signal.

8. The semiconductor memory device according to claim 7, wherein the buffer includes an inverter, and the third logic unit performs a NAND operation.

9. The semiconductor memory device according to claim 6, wherein the second pulse generator includes:

a delay configured to delay the output signal of the second logic unit by a predetermined time, and output the delayed signal;

a buffer configured to buffer an output signal of the delay; and a third logic unit configured to perform a logic operation between an output signal of the buffer and the output signal of the second logic unit, and generate the second pulse signal.

10. The semiconductor memory device according to claim 9, wherein the buffer includes an inverter, and the third logic unit performs a NAND operation.

11. The semiconductor memory device according to claim 1, wherein the first signal generator includes:

a first pull-up element configured to pull-up drive a specific node in response to a reset signal generated from the reset controller;

a first pull-down element configured to pull-down drive the specific node in response to the reset signal;

a second pull-down element located between the first pull-down element and a ground terminal, and operated by the active command; and a latch unit configured to latch a signal of the specific node, and at the same time inversely buffering the signal of the specific node, and generate the inversely-buffered signal.

12. The semiconductor memory device according to claim 11, wherein the first signal generator further includes:

a second pull-up element configured to pull-up drive the specific node in response to a power-up or initialization signal.

13. The semiconductor memory device according to claim 1, wherein the second signal generator includes:

a first pull-up element configured to pull-up drive a first node in response to a precharge signal;

a first pull-down element configured to pull-down drive the first node in response to a specific control signal;

a first logic unit configured to perform a logic operation between a signal of the first node and the first latch signal;

a first latch unit configured to latch an output signal of the first logic unit;

a buffer configured to invert and buffer the output signal of the first latch unit, and generate the word-line activation signal; and a signal processor configured to receive the word-line activation signal, and generate the activation-information signal.

14. The semiconductor memory device according to claim 13, wherein the second signal generator further includes:

a delay configured to delay the word-line activation signal by a predetermined period, and provide the delayed word-line activation signal as the control signal.

15. The semiconductor memory device according to claim 13, wherein the second signal generator further includes:

a second latch unit located between the first pull-down element and the first logic unit, wherein said second latch unit latches the signal of the first node, and at the same time buffers the latched signal, and transmits the buffered signal to the first logic unit.

16. The semiconductor memory device according to claim 13, wherein the first latch unit includes:

a second logic unit configured to receive the output signal of the first logic unit at its input terminal; and a third logic unit configured to receive the chip selection signal at its input terminal, wherein the second logic unit and the third logic unit are cross-coupled to each other.

17. The semiconductor memory device according to claim 16, wherein the second logic unit and the third logic unit are respective NAND gates.

18. The semiconductor memory device according to claim 13, wherein the first logic unit performs an AND operation.

19. The semiconductor memory device according to claim 13, wherein the signal processor disables the activation-information signal by referring to an enabling state of the precharge signal.

20. The semiconductor memory device according to claim 19, wherein the signal processor includes:

a second pull-up element configured to pull-up drive a second node in response to the word-line activation signal;

a second pull-down element configured to pull-down drive the second node in response to the word-line activation signal;

a third pull-up element located between the second pull-up element and an external-voltage terminal, and operated by the precharge signal; and a second latch unit configured to latch the signal of the first node, buffer the first-node signal, and generate the activation-information signal.

21. The semiconductor memory device according to claim 20, wherein the signal processor further includes:

a fourth pull-up element configured to pull-up drive the second node in response to a power-up or initialization signal.

22. The semiconductor memory device according to claim 13, wherein the second signal generator further includes:

a second pull-up element configured to pull-up drive the first node in response to a power-up or initialization signal.

23. The semiconductor memory device according to claim 1, wherein the semiconductor memory device is a pseudo SRAM (PSRAM).

24. The semiconductor memory device according to claim 1, wherein:

the word-line activation signal is adapted to activate a word line; and the activation-information signal maintains activation information of the word-line activation signal during a predetermined period.

25. The semiconductor memory device according to claim 1, wherein the second latch signal latches the chip selection signal in synchronization with a clock signal.

26. The semiconductor memory device according to claim 1, wherein the reset controller controls the first signal generator in response to the disabling of the second latch signal or the enabling of the word-line activation signal.

* * * * *